United States Patent [19]

Page

[11] Patent Number: 4,755,795
[45] Date of Patent: Jul. 5, 1988

[54] ADAPTIVE SAMPLE RATE BASED ON INPUT SIGNAL BANDWIDTH

[75] Inventor: Richard W. Page, Los Altos, Calif.

[73] Assignee: Hewlett-Packard Company, Palo Alto, Calif.

[21] Appl. No.: 927,617

[22] Filed: Oct. 31, 1986

[51] Int. Cl.⁴ ............................................. H03M 7/00
[52] U.S. Cl. ...................... 340/347 SH; 340/347 AD; 340/347 DD
[58] Field of Search ............... 340/347 AD, 347 DD, 340/347 SH; 364/827; 375/80; 381/32

[56] References Cited

U.S. PATENT DOCUMENTS

| | | | |
|---|---|---|---|
| 3,634,760 | 1/1972 | Murtin et al. | 364/827 X |
| 3,746,997 | 7/1973 | Willett et al. | 381/32 |
| 4,359,608 | 11/1982 | Watson | 375/80 |
| 4,568,912 | 2/1986 | Kitamura et al. | 340/347 DA X |

Primary Examiner—William M. Shoop, Jr.
Assistant Examiner—Richard Blum
Attorney, Agent, or Firm—James M. Williams

[57] ABSTRACT

A method and apparatus selects an appropriate sampling rate for an input signal based on a dynamic measurement of the bandwidth of the signal. In the preferred embodiment, the bandwidth of the input signal is determined by comparing the power of the entire input signal with the power of the input signal within a selected bandwidth. A discrete Fourier transform is used to perform the bandwidth analysis.

2 Claims, 4 Drawing Sheets

$$P_{\omega/\omega_0} = \frac{\int_{-\omega_0}^{\omega_0} S_{xx}(\omega)\, d\omega}{\int_{-\infty}^{\infty} S_{xx}(\omega)\, d\omega} \qquad (1)$$

$$X(n,\omega) = \sum_{m=-\infty}^{\infty} h(n-m)\, x(m)^{-j\omega m} \qquad (2)$$

$$X(n,k) = \sum_{m=-\infty}^{\infty} x(m)^{-j2\pi km/N} \qquad (3)$$

$$S_k(\omega) = e^{-j[\omega(n-1)]/2}\, e^{j\pi k/N}\, \sin(n\omega/2)/\sin(\omega/2 + \pi k/N) \qquad (4)$$

$$S_0(\omega) = e^{-j[\omega(N-1)]/2}\, \sin(N\omega/2)/\sin(\omega/2) \qquad (5)$$

FIG 2

ADAPTIVE SAMPLE RATE BASED ON INPUT SIGNAL BANDWIDTH

BACKGROUND AND SUMMARY OF THE INVENTION

The invention relates generally to apparatus for compressing data for storage or transmission, and more particularly to a method and apparatus for compressing input signal data for storage in a waveform recorder based on the bandwidth of the signal.

Data compression can be used to reduce the data storage capacity or the transmission bandwidth requirements of an instrument or data communications system. Taking advantage of the redundancies in the original input signal, only the data points needed to represent the nonredundant information of the signal are stored or transmitted, and intermediate data points are eliminated.

In digital systems for storing a representation of analog signals, the sampling rate should be above the Nyquist frequency of the input signal. The higher the bandwidth of the input signal, the higher the sampling rate must be. Similarly, for signals with a low bandwidth, the sampling rate can be lower. For various reasons, it is impractical to change the initial rate at which the input signal is sampled. It is easier to sample at a uniform high rate, then resample before storing or transmitting the sampled signal. In the resampling step, the redundant data points of low bandwidth signals can be eliminated. The original signal can be reconstructed from the stored data points and information defining the sampling rate.

Data compression is particularly advantageous in waveform recorders and analyzers. These instruments store data from an event or a signal transient. In order to capture the most detailed information possible, the sampling is done at a very high rate, and stored in a very fast memory. To achieve the high speed required at an economic cost, the memory must be relatively small. Using data compression techniques, the apparent size of the memory can be increased, and data can be stored for a longer event or transient without compromising the frequency of the sampling rate used for intervals with high information content.

Early data compression devices used analog techniques, based on the amplitude or the slope of the input signal. The amplitude based devices compared the amplitude of the input signal to a threshold. The signal was sampled and data stored when the input signal amplitude exceeded the threshold, and no data was stored when the amplitude was below the threshold. Similarly, the slope based devices compared the rate of change of the input signal amplitude to a threshold, and sampled and stored data only when the slope exceeded the threshold.

The simple analysis performed by the amplitude and the slope techniques limited the amount of data compression that could be achieved for a given input signal, and thereby limited the amount of useful information that could be stored in a limited size memory.

Another approach used a digital technique, with digital filters to analyze the frequency content of an input signal. The sampling rate was adjusted as a function of the highest frequency component of the input signal. This approach allowed a more sophisticated analysis of the input signal, and provided for multiple sampling rates. However, it has several disadvantages. In particular, high frequency noise in the input signal can cause the sampling rate to remain high even when the actual bandwidth and information content is low.

One object of the invention is to provide a method and apparatus for making a more accurate analysis of the information content of an input signal and accordingly performing enhanced data compression.

Another object of the invention is to provide a method and apparatus for selecting an appropriate sampling rate for an input signal based on a dynamic measurement of the bandwidth of the signal.

To achieve these and other objects, in accordance with the teachings of the invention, an appropriate sampling rate is selected by applying a short time Fourier transform to the input signal to measure the bandwidth of the input signal and changing the sampling rate as a function of the bandwidth. In the preferred embodiment, the bandwidth of the input signal is determined by comparing the power of the entire input signal with the power of the input signal within a selected bandwidth. A discrete fourier transform is used to perform the bandwidth analysis.

BRIEF DESCRIPTION OF THE DRAWINGS

FIG. 2 depicts five equations used in deriving and implementing the adaptive sampling rate technique of the invention.

DETAILED DESCRIPTION OF THE INVENTION

Figure 1:
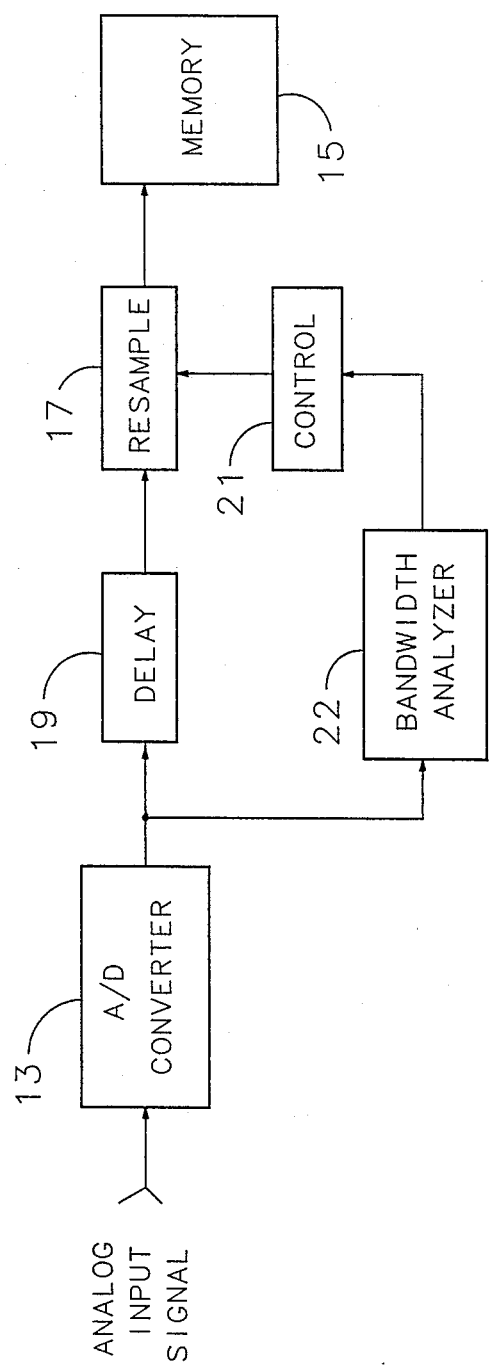
FIG. 1 is a schematic block diagram of an analog to digital converter (ADC) system which embodies the adaptive sampling rate technique of the invention.

An analog to digital converter (ADC) system which embodies the adaptive sampling rate of the invention is shown in FIG. 1. ADC 13 samples an input signal, generating data for storage in a high speed memory 15, from which the data can later be read for display or processing. ADC 13 samples the analog input signal at a sampling rate high enough to capture the highest frequency components of interest in the input signal. For a waveform recorder, the sampling rate could be in the range from 4 to 250 megasamples per second. The sampling rate is controlled by a master clock signal from a clock generator, not shown.

To maximize the information content of the data stored in memory 15, the stream of digital data points from ADC 13 is compressed when a lower sampling rate is sufficient to capture the input waveform. This data compression is done by resampling the stream of digital data points at resampler 17 before the data is stored.

Resampler 17 samples up to a maximum sample rate equal to that used by the ADC 13, or at a significantly lower rate for low bandwidth signals. For application in a waveform recorder, the sampling rates could differ by a factor of 64, e.g., with the high sampling rate on the order of 20 MHz and the low sampling rate on the order of 3 MHz. The sampling frequency of resampler 17 is controlled by a controller 21, which in turn receives signal bandwidth information from the bandwidth analyzer 22.

Between ADC 13 and resampler 17, the stream of digital data from ADC 13 passes through time delay 19 equivalent to the delay through analyzer 23. This assures that the data from ADC 13 and the sampling rate selection signal for that data from controller 21 arrive at the resampler 17 simultaneously.

In addition to resampling the digital data stream for storage in memory 15, resampler 17 appends to each digital data word a one-bit flag indicating whether the high sampling rate or the low sampling rate was being used at the time the particular data point was sampled. This sample rate flag is used to reconstruct the signal from the data stored in memory 15. The need to include such a sampling rate flag in the stored data places a practical limit on the number of sampling rates which can be applied. For example, if a large number of sampling rates is used, each data point stored must include a multi-bit flag to indicate the sampling rate. These long flags occupy the storage space that the data compression scheme was intended to conserve. Thus, a practical compromise must be reached on the number of sampling frequencies employed.

The bandwidth analyzer 22 selects the sampling rates for resampler 17. Analyzer 22 compares the overall power of the input signal to the power of a portion of the input signal in a certain bandwidth. If the power of the chosen bandwidth portion is within a predetermined range of the overall power of the input signal, the probability that the frequency components of the input signal are within the chosen bandwidth is high, and the sampling can be done at a rate appropriate for the chosen bandwidth without losing any significant information content. On the other hand, if the power of the chosen bandwidth portion is significantly less than the overall power, the input signal has a high bandwidth and a higher sampling rate should be selected to assure that the information content of the signal is captured.

Instead of attempting to determine the actual bandwidth of the input signal, according to the invention an estimate of the bandwidth of the input signal is made by comparing the power of the overall signal to the power of the signal in a selected frequency range.

This is accomplished by using the properties of the Fourier transform of the signal and the power spectral density function. The power spectral density function of a signal is a normalized measure of where the input energy lies in the frequency spectrum. The integral of the power spectral density function over a bandwidth reflects the probability that the input signal energy is within that bandwidth.

Accordingly, the function of interest is the ratio of the power spectral density integrated over the prescribed bandwidth to the power spectral density integrated over the entire spectrum, see FIG. 2, equation (1). The denominator is the power of the overall signal and can be easily determined from the mean squared value of the input signal. The numerator is more difficult. The conventional method to determine its value would be to pass the input signal through a low pass filter, then take the means squared value of the filtered signal. The present invention dispenses with the filter and uses a method based on the Fourier transform of the input signal instead.

For real functions, the power spectral density is equal to the square of the absolute value of the Fourier transform. For a digitally sampled signal, the appropriate function is a Discrete Fourier Transform (DFT). In order to monitor the changing bandwidth of non-stationary signals, a short-time Fourier transform is appropriate, resulting in two coincident sampling processes, in time and in frequency.

The short-time Fourier transform of a sampled signal x(n) over an "analysis window" of h(n) is given in FIG. 2, equation (2). In effect the short-time DFT samples the input signal during the "analysis window" in the time domain and divides the signal's spectral components into discrete spectrum "bins" in the frequency domain. Choosing a rectangular analysis window, with $h(n)=1$ for $0<n<2^k$, and $h(n)=0$ otherwise, and sampling in w such that $w=2\pi k/N$, results in equation (3) of FIG. 2, which is the N point DFT of x(n). In this equation, there are two sampling processes, ont in time to generate x(n), and one in w to generate x(n,k). The short time spectrum is the output of a filter with the system function given by equation (4), FIG. 2.

The "bin zero" filter has the system function given by equation (5), FIG. 2. This filter has constant group delay and piece-wise linear phase. If an input signal x(n) is applied to this filter, the output will correspond to "bin zero" of an N point running DFT of the input signal. The power spectral density is estimated as the square of the filter output over the frequency range of interest.

The DFT essentially samples the spectrum, that is, it divides the spectrum into discrete bins. All of the energy falling into a bin is reported at the center of the bin. The short time windowing narrows the duration of the analysis filter in both time and frequency. Since the DFT zero bin is chosen with a width smaller than the sampling rate of the ADC divided by the desired data compression ratio, if all of the input signal power is in the discrete fourier transform zero bin, the data stream can be safely resampled at the reduced sampling rate.

In its basic form, the data compression system of the invention selects between two sampling rates. A high-speed sampling rate is selected when the input data stream has a bandwidth above a predetermined threshold and a lower speed sampling rate is selected when the input data stream bandwidth is below the threshold. It will be understood that the invention contemplates multiple sampling rates as well as the dual sampling rate system described. A multiple sampling rate system uses additional bandwidth thresholds and appropriate sampling rate for each additional bandwidth.

Figure 3:
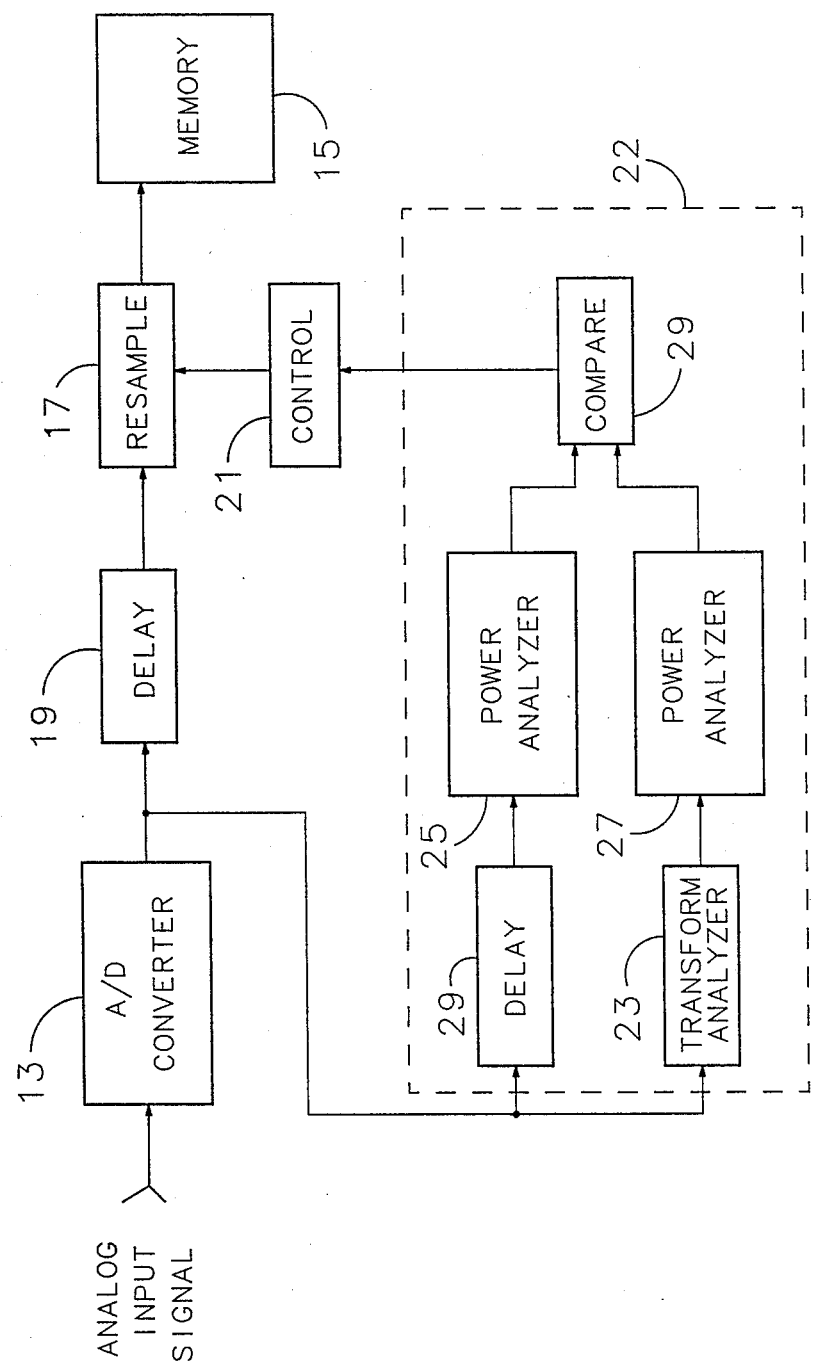
FIG. 3 is a schematic block diagram of an analog to digital converter (ADC) system which applies the adaptive sampling rate technique of the invention with two sampling rates.

A data compression circuit with two sampling rates which embodies the invention is shown in FIG. 3. This circuit could be used, for example to compress the input data stream of a waveform recorder. The circuit of FIG. 3 has the same organization as the circuit of FIG. 1, and elements that perform equivalent functions have the same reference numerals. The bandwidth analyzer 22 is shown in more detail in FIG. 3.

In bandwidth analyzer 22, the data stream follows two paths. In one path, transform analyzer 23 and power analyzer 27 determine the relative power of the input signal in a restricted bandwidth. In the other path, the signal passes through a delay 26 to power analyzer 25 to determine the power of the overall signal. The delay 26 is equivalent to the delay through transform analyzer 23 so the output of the two paths is synchronized.

Transform analyzer 23 performs the DFT on the digital data stream from ADC coverter 13. The output from analyzer 23 corresponds to the "bin zero" result of an N point running DFT of the input signal. The power spectral density is estimated as the square of the output from analyzer 23. To obtain the power spectral density function of the time changing input signal, analyzer 23 performs a DFT on a number of consecutive data points, and monitors the evolution of the Fourier transform of the input signal over time.

The "analysis window" of the DFT is chosen with N samples included, such that the width of the DFT bin zero is less than $f_s/L$, where $f_s$ is the high sampling rate and L is the desired decimation ratio to achieve the low sampling rate. If substantially all of the power of the input signal is found in DFT zero bin, the ratio of equation (1) will be close to one, and the signal can be sampled at the low rate without losing information.

The "bin zero" of the DFT can be of FIG. 2. This filter function has constant group delay and piece-wise linear phase. The output of this filter is an N point running DFT of the input signal, and corresponds to the sampled value of the input signal in bin zero of the transform.

Figure 4:
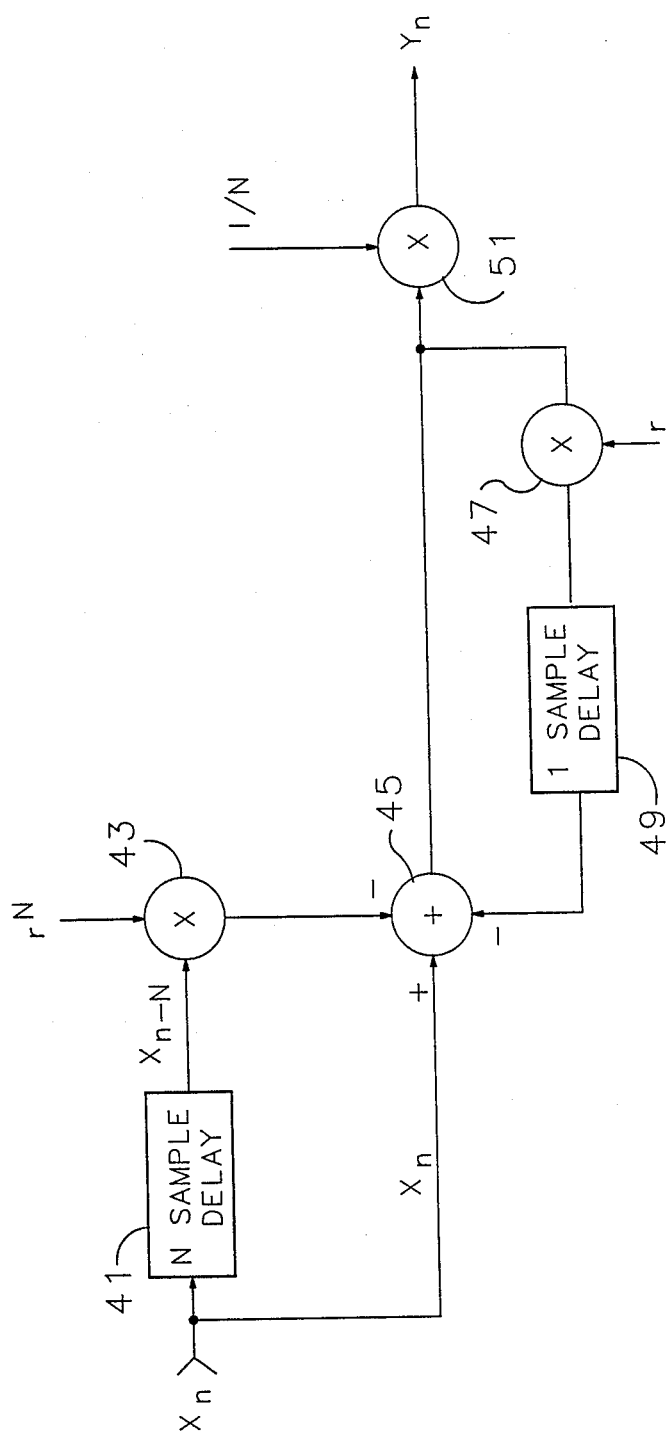
FIG. 4 is schematic diagram of a digital filter circuit that implements the filter function given in equation (5) of FIG. 2.

The schematic diagram of a digital filter circuit that implements the filter function given in equation (5) is shown in FIG. 4. The input signals x(n) are applied to the positive input of adder 45. The input signals are also passed through an N sample delay 41 to provide an $x(n-N)$ input which is multiplied by $r^N$ in multiplier 43. The output from multiplier 43, $x(n-N)r^N$, is applied to a negative input of adder 45. The output of adder 45 is multiplied by 1/N in multiplier 51. The output of adder 45 is also passed through a feedback circuit comprised of multiplier 47, which multiplies the signal by r, and one sample delay 49, then applied to a negative input of adder 45. The factor r is a stability factor, chosen to guarantee the stability of the filter.

The spectral density integral of the limited bandwidth input signal can thus be determined by passing the input signal through a filter producing a function according to equation (5), then squaring the output. However, squaring is an expensive operation to perform, especially at high data throughput rates. A much less expensive alternative is a mean absolute value estimate. This approach produces only a relative power measurement, but that is sufficient because only a valid ratio measurement, of the limited bandwidth power to the overall power, is required.

The power analyzers 25 and 27 are implemented in an auto-regressive moving average network that operates on the same number N data points as the bandwidth analyzer. The choice of N for this system is a tradeoff. For larger values of N, the variance decreases, but the ability to track nonstationary signal behavior also decreases.

Comparator 29 compares the output signal from transform analyzer 25 to the output signal of transform analyzer 27. Comparator 29 produces a control signal for sample frequency selector 21 to select either a high sampling rate or a low sampling rate for resampler 17.

For an adaptive sampling rate system with a third sampling rate for an intermediate bandwidth, another transform analyzer, power analyzer and comparator are required. The second transform analyzer is set to determine the power spectral density for the intermediate bandwidth. In addition to comparing the overall power to the power in the bandwidth of the first analyzer, a second comparison is made between the overall power and the power in the intermediate bandwidth of the second analyzer. The narrowest bandwidth at which the power ratio is equal to one plus or minus the error function delta determines the sampling rate.

What is claimed is:

1. Apparatus for compressing a digital input signal by sampling the signal at a variable rate based on the bandwidth of the signal, comprising:
   means for receiving the digital input signal and sampling the digital input signal at one of a plurality of sampling rates;
   means responsive to the digital input signal for making a sample by sample estimate of the instantaneous bandwidth of the signal, by comparing the power of the entire input signal with the power of the input signal within a selected bandwidth by applying a short-time discrete Fourier transform to the digital input signal, and for producing an output signal if the power of the entire input signal is greater than the power of the input signal within the selected bandwidth by more than a predetermined amount;
   means responsive to the output signal of the power comparing means for causing the sampling means to sample the digital input signal at a lower sampling rate.

2. The apparatus of claim 1 wherein the digital input signal comprises the output data stream from an analog to digital converter, and the sampling means resamples the output signal at one of a plurality of sampling rates, lower than or equal to the sampling rate of the analog to digital converter.

* * * * *